(12) United States Patent
Wang et al.

(10) Patent No.: US 10,459,282 B2
(45) Date of Patent: Oct. 29, 2019

(54) DISPLAY DEVICE (71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qian Wang, Beijing (CN); Xue Dong, Beijing (CN); Xiaochuan Chen, Beijing (CN); Pengcheng Lu, Beijing (CN); Xiaochen Niu, Beijing (CN); Jian Gao, Beijing (CN); Ming Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 72 days.

(21) Appl. No.: 15/529,581

(22) PCT Filed: Aug. 15, 2016

(86) PCT No.: PCT/CN2016/095218
§ 371 (c)(1),
(2) Date: May 25, 2017

(87) PCT Pub. No.: WO2017/177587
PCT Pub. Date: Oct. 19, 2017

(65) Prior Publication Data
US 2018/0188599 A1 Jul. 5, 2018

(30) Foreign Application Priority Data

Apr. 11, 2016 (CN) .......................... 2016 1 0222445

(51) Int. Cl.
*G02F 1/1335* (2006.01)
*H01L 27/32* (2006.01)

(52) U.S. Cl.
CPC .. *G02F 1/133528* (2013.01); *G02F 1/133602* (2013.01); *G02F 1/133603* (2013.01);
(Continued)

(58) Field of Classification Search
CPC ... G02F 1/133602; G02F 2001/133607; G02F 1/133603; G09G 3/3208
See application file for complete search history.

(56) References Cited

U.S. PATENT DOCUMENTS

2005/0041174 A1    2/2005  Numata et al.
2006/0204679 A1*   9/2006  Jones ............... B82Y 20/00
                                                      428/1.3
(Continued)

FOREIGN PATENT DOCUMENTS

CN    201429935 Y    3/2010
CN    101742750 A    6/2010
(Continued)

OTHER PUBLICATIONS

First Office Action for Chinese Patent Application No. dated May 25, 2018.
(Continued)

*Primary Examiner* — Alexander P Gross
(74) *Attorney, Agent, or Firm* — Calfee, Halter & Griswold LLP (57) ABSTRACT The present disclosure relates to the field of display technologies, and discloses a display device for reducing a thickness of the display device, so as to obtain a thinner display device and simplify the manufacture process. The display device includes a first substrate and a second substrate arranged oppositely; as well as a plurality of color
(Continued)

(a)

(b)

control light-emitting units, a wire grid polarizer and a plurality of transmittance adjustment pixel units arranged sequentially from an inner side of the first substrate towards an inner side of the second substrate.

7 Claims, 5 Drawing Sheets

(52) U.S. Cl.
CPC ........ *G02F 1/133606* (2013.01); *H01L 27/32* (2013.01); *H01L 27/3232* (2013.01); *G02F 2001/133548* (2013.01); *H01L 27/322* (2013.01)

(56) References Cited

U.S. PATENT DOCUMENTS

| | | | | |
|---|---|---|---|---|
| 2009/0296008 | A1* | 12/2009 | Kawamura | G02B 27/286 349/5 |
| 2010/0118222 | A1* | 5/2010 | Lee | G02F 1/13362 349/40 |
| 2010/0165238 | A1* | 7/2010 | Kajita | G02F 1/133603 349/58 |
| 2014/0168745 | A1* | 6/2014 | Satou | G02F 1/163 359/266 |
| 2014/0226110 | A1* | 8/2014 | Doyle | G02F 1/133603 349/69 |
| 2014/0313455 | A1 | 10/2014 | Nam et al. | |
| 2014/0339563 | A1* | 11/2014 | Huang | H01L 27/124 257/72 |
| 2016/0091752 | A1 | 3/2016 | Lien et al. | |
| 2016/0349589 | A1 | 12/2016 | Sun et al. | |
| 2017/0220158 | A1 | 8/2017 | Peng et al. | |
| 2017/0256754 | A1* | 9/2017 | Defranco | H01L 51/56 |
| 2017/0357126 | A1 | 12/2017 | Zhao | |

FOREIGN PATENT DOCUMENTS

| | | |
|---|---|---|
| CN | 104216167 A | 12/2014 |
| CN | 104793393 A | 7/2015 |
| CN | 104834146 A | 8/2015 |
| CN | 105278166 A | 1/2016 |
| CN | 105468201 A | 4/2016 |
| CN | 105700212 A | 6/2016 |
| JP | 2008041234 A | 2/2008 |
| JP | 2009092972 A | 4/2009 |

OTHER PUBLICATIONS

International Search Report for Chinese International Application No. PCT/CN2016/095218 dated Dec. 28, 2016.

\* cited by examiner

DISPLAY DEVICE

The present application is the U.S. national phase entry of PCT/CN2016/095218, with an international filling date of Aug. 15, 2016, which claims the benefit of Chinese Patent Application No. 201610222445.3, filed on Apr. 11, 2016, the entire disclosures of which are incorporated herein by reference.

FIELD

The present disclosure relates to the field of display technologies, and in particular to a display device.

BACKGROUND ART

A typical display device comprises an Organic Light-Emitting Diode (OLED) light-emitting panel and a Liquid Crystal Display (LCD) light-regulating panel. In such a display device, the OLED light-emitting panel emits red light, green light and blue light. After that, the LCD light-regulating panel adjusts light transmittances of the incident red light, green light and blue light, thereby realizing display.

Specifically, the OLED light-emitting panel comprises a substrate provided with an anode (also referred to as an anode substrate), a substrate provided with a cathode (also referred to as a cathode substrate), and an organic light-emitting functional layer arranged therebetween. The LCD light-regulating panel includes an array substrate, a counter substrate, a liquid crystal layer arranged therebetween, as well as an upper polarizer (POL) and a lower polarizer (POL) arranged respectively on outer sides of the two substrates.

The display device typically comprises four substrates. Moreover, since the lower POL needs to be arranged on an outer side of the substrates, the substrates cannot be reduced in number. This in turn results in a large thickness of a typical display device and disfavors thinning of the display device. It is also necessary to bond the OLED light-emitting panel and the LCD light-regulating panel through a binder (e.g., OCA), which makes the manufacture process quite complicated.

SUMMARY

Embodiments of the present disclosure provide a display device for reducing a thickness of the display device so as to obtain a thinner display device and simplify the manufacture process.

According to a certain exemplary embodiments, an embodiment of the present disclosure provides a display device. The display device includes a first substrate and a second substrate arranged oppositely. The display device further comprises a plurality of color control light-emitting units, a wire grid polarizer and a plurality of transmittance adjustment pixel units arranged sequentially from an inner side of the first substrate towards an inner side of the second substrate.

In certain exemplary embodiments, each transmittance adjustment pixel unit includes a liquid crystal layer, as well as a pixel electrode and a common electrode for providing a driving electric field to the liquid crystal layer.

In certain exemplary embodiments, the pixel electrode and the common electrode are located on a same side of the liquid crystal layer. Furthermore in certain exemplary embodiments, the wire grid polarizer is grounded. Alternatively, the display device further comprises a transparent conductive layer. The transparent conductive layer is grounded, and located between the color control light-emitting units and the transmittance adjustment pixel units.

In certain exemplary embodiments, each color control light-emitting unit includes a light-emitting functional layer, as well as an anode and a cathode located on two sides of the light-emitting functional layer respectively.

In certain exemplary embodiments, the cathode is further away from the first substrate than the anode is. Besides, each transmittance adjustment pixel unit includes a liquid crystal layer and a pixel electrode located on a side of the liquid crystal layer. The pixel electrode and the cathode are used for providing a driving electric field to the liquid crystal layer.

In certain exemplary embodiments, the display device further comprises a light correction section. The light correction section is located between the color control light-emitting units and the transmittance adjustment pixel units. Furthermore, the light correction section is used for correcting incident light rays into exit light rays perpendicular to the second substrate.

In certain exemplary embodiments, the light correction section includes a diffraction grating and a first dielectric layer. The diffraction grating comprises a grating surface and a groove surface. The groove surface comprises a plurality of sub-groove surfaces, each sub-groove surface being arranged obliquely. The grating surface is a light incident surface and the groove surface is a light exit surface. Besides, the first dielectric layer is located on the groove surface of the diffraction grating. Moreover, light rays emitted out from the diffraction grating becomes exit light rays perpendicular to the second substrate after being refracted by the light exit surface of the first dielectric layer.

In certain exemplary embodiments, the light correction section further comprises a second dielectric layer. The second dielectric layer is located on the light exit surface of the first dielectric layer. Besides, a light exit surface of the second dielectric layer is parallel to the second substrate.

In certain exemplary embodiments, the sub-groove surfaces are arranged in parallel to each other. Further in certain exemplary embodiments, the light exit surface of the first dielectric layer comprises a ramp or a plurality of parallel refractive sub-surfaces.

In certain exemplary embodiments, an oblique direction of the sub-groove surfaces is opposite to that of the light exit surface of the first dielectric layer.

In certain exemplary embodiments, the light correction section comprises a diffraction grating. The diffraction grating comprises a grating surface and a groove surface. The groove surface comprises a plurality of sub-groove surfaces, and the sub-groove surfaces are parallel to the second substrate. The grating surface is a light incident surface and the groove surface is a light exit surface.

In certain exemplary embodiments, the light correction section further comprises a first dielectric layer. The diffraction grating is located on the first dielectric layer. Besides, the grating surface of the diffraction grating fits the first dielectric layer.

In certain exemplary embodiments, the diffraction grating comprises notch sections arranged cyclically. The notch sections in each cycle comprise notch groups arranged sequentially. Each notch group has a same number of notch sections. Notch sections in a same notch group have a same shape, and notch sections in different notch groups have different shapes.

In a display device provided according to embodiments of the present disclosure, the lower POL is replaced by a wire grid polarizer. Besides, the wire grid polarizer can be arranged on an inner side of a substrate. As a result, the two substrates inside the display device can be omitted with only the first substrate and the second substrate retained. This helps to reduce a thickness of the display device.

According to certain exemplary embodiments, an embodiment of the present disclosure further provides a display device. The display device includes a plurality of color control light-emitting units; a light correction section located in a light exit direction of the color control light-emitting units, wherein the light correction section is used for correcting incident light rays into vertical light rays; and a plurality of transmittance adjustment pixel units arranged in a light exit direction of the light correction section.

In an embodiment of the present disclosure, by adding a light correction section in the display device, light rays emitted from the color control light-emitting units are corrected into vertical light rays, such that the display device can emit approximately vertical light rays. This helps to facilitate subsequent control of the light rays.

BRIEF DESCRIPTION OF DRAWINGS

In order to illustrate technical solutions in embodiments of the present disclosure more clearly, drawings to be used in depictions of these embodiments will be briefly introduced below. Apparently, drawings in the depictions below are only some embodiments of the present disclosure. For those having ordinary skills in the art, other embodiments can be further obtained based on these drawings as below without any inventive efforts.

DETAILED DESCRIPTION OF EMBODIMENTS

Reference signs are listed as follows:
1—display device;
11—first substrate;
12—second substrate;
13—color control light-emitting unit;
130—light-emitting functional layer;
131—anode;
132—cathode;
14—wire grid polarizer;
15—transmittance adjustment pixel unit;
150—liquid crystal layer;
151—pixel electrode;
152—common electrode;
16—polarizer;
17—transparent conductive layer;
18—light correction section;
40—diffraction grating;
40a—grating surface;
40b—groove surface;
41, 51—first dielectric layer;
41b—light exit surface of first dielectric layer;
41b_1—refractive sub-surface;
41b_2—connection sub-surface;
42, 52—second dielectric layer.

Technical solutions in embodiments of the present disclosure will be described clearly and completely below with reference to drawings of embodiments of the present disclosure. Apparently, these embodiments described below are only some embodiments of the present disclosure, instead of all of them. All other embodiments obtainable by those having ordinary skills in the art without inventive efforts based on these embodiments as shown in the present disclosure shall fall within the protection scope of the present disclosure.

In order to clearly describe technical solutions of embodiments of the present disclosure, same items or similar items having essentially same functions and effects are distinguished by terms such as "first" and "second". Those skilled in the art can understand that terms such as "first" and "second" do not define the number or the sequence of execution.

Figure 1:
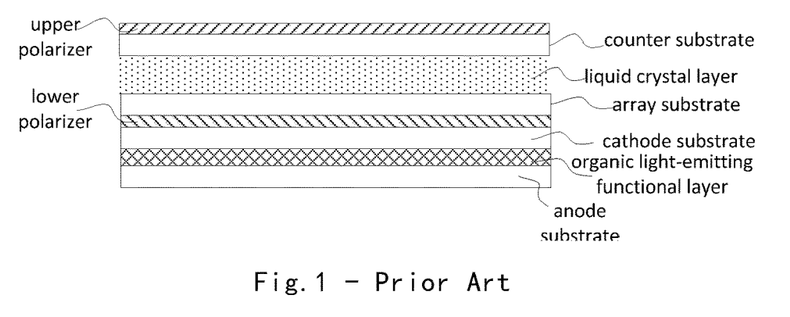
FIG. 1 is a schematic view of a typical display device.

Referring to FIG. 1, a typical display device comprises an Organic Light-Emitting Diode (OLED) light-emitting panel and a Liquid Crystal Display (LCD) light-regulating panel. In such a display device, the OLED light-emitting panel emits red light, green light and blue light. After that, the LCD light-regulating panel adjusts light transmittances of the incident red light, green light and blue light, thereby realizing display.

Specifically, the OLED light-emitting panel comprises a substrate provided with an anode (also referred to as an anode substrate), a substrate provided with a cathode (also referred to as a cathode substrate), and an organic light-emitting functional layer arranged therebetween. The LCD light-regulating panel includes an array substrate, a counter substrate, a liquid crystal layer arranged therebetween, as well as an upper polarizer (POL) and a lower polarizer (POL) arranged respectively on outer sides of the two substrates.

As seen in FIG. 1, the display device typically comprises four substrates. Moreover, since the lower POL needs to be arranged on an outer side of the substrates, the substrates cannot be reduced in number. This in turn results in a large thickness of a typical display device and disfavors thinning of the display device.

The basic principle of embodiments of the present disclosure lies in that the lower POL can be replaced by a wire grid polarizer. The wire grid polarizer can be arranged on an inner side of a substrate and specifically by an existing patterning process or the like. As a result, two substrates inside the display device can be omitted, which reduces a thickness of the display device.

Specific embodiments will be provided as follows based on the above principle.

Figure 2:
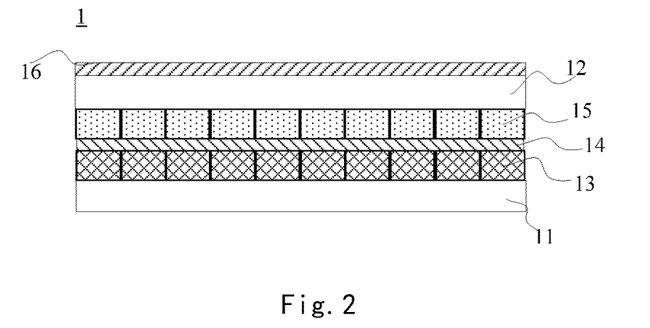
FIG. 2 is a schematic structure view of a display device provided according to an embodiment of the present disclosure.

An embodiment of the present disclosure provides a display device 1. Referring to FIG. 2, the display device 1 includes a first substrate 11 and a second substrate 12 arranged oppositely. The display device 1 further comprises a plurality of color control light-emitting units 13, a wire grid polarizer 14 and a plurality of transmittance adjustment pixel units 15 arranged sequentially from an inner side of the first substrate 11 towards an inner side of the second substrate 12, i.e., from bottom to top between the first substrate 11 and the second substrate 12 in the drawing.

Each component in the display device provided in an embodiment of the present disclosure will be introduced below respectively.

The first substrate 11 and the second substrate 12 can be made of conventional materials. For example, they can be made of glass. In this embodiment, the second substrate 12 is a substrate on a display side.

The so-called color control light-emitting units 13 refer to light-emitting components capable of emitting light rays of a desired color. As for the color of light rays to be emitted, it can be selected by those skilled in the art upon actual needs. For example, if the display device is of an RGB type, the plurality of color control light-emitting units 13 herein can comprise a red light-emitting unit, a green light-emitting unit and a blue light-emitting unit. As another example, if the display device is of an RGBW type, the plurality of color control light-emitting units 13 can further comprise a white light-emitting unit. As yet another example, if the display device is of a CMY type, the plurality of color control light-emitting units 13 herein can comprise a cyan light-emitting unit, a magenta light-emitting unit and a yellow light-emitting unit. In this embodiment, a display device of an RGB type is taken as an example.

Figure 3:
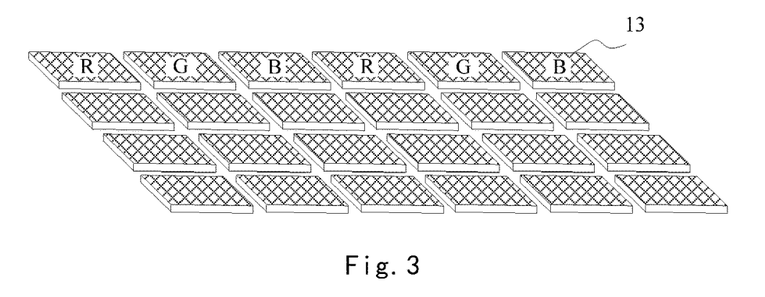
FIG. 3 is a schematic arrangement view of a color control light-emitting unit in FIG. 2.

The plurality of color control light-emitting units 13 can be arranged in a 2D dot matrix. For example, referring to FIG. 3, each color control light-emitting unit 13 is a light-emitting spot capable of emitting light rays of a certain color. Moreover, a red light-emitting unit R, a green light-emitting unit G and a blue light-emitting unit B form a group of light-emitting units. Besides, multiple groups of light-emitting units are arranged in an array.

Figure 4:
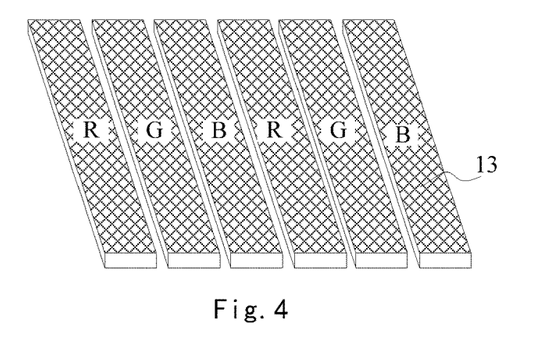
FIG. 4 is another schematic arrangement view of a color control light-emitting unit in FIG. 2.

The plurality of color control light-emitting units 13 can be further arranged in a one-dimensional array. That is to say, these color control light-emitting units 13 are arranged in one row in a direction. For example, referring to FIG. 4, each color control light-emitting unit 13 is a light-emitting strip capable of emitting light rays of a certain color. Besides, the red light-emitting unit R, the green light-emitting unit G and the blue light-emitting unit B are arranged periodically in a width direction of the light-emitting strip.

Exemplarily, the color control light-emitting units 13 can be spot lights source or lamp strips or the like. For a purpose of integrating the color control light-emitting units 13 into the display device, preferably, referring to FIG. 5a-5e, each color control light-emitting unit 13 comprises in this embodiment: a light-emitting functional layer 130, as well as an anode 131 and a cathode 132 located on two sides of the light-emitting functional layer respectively. Specifically, the light-emitting functional layer 130 can emit light rays of a predetermined color under a driving electric field formed by the anode 131 and the cathode 132.

Figure 5:
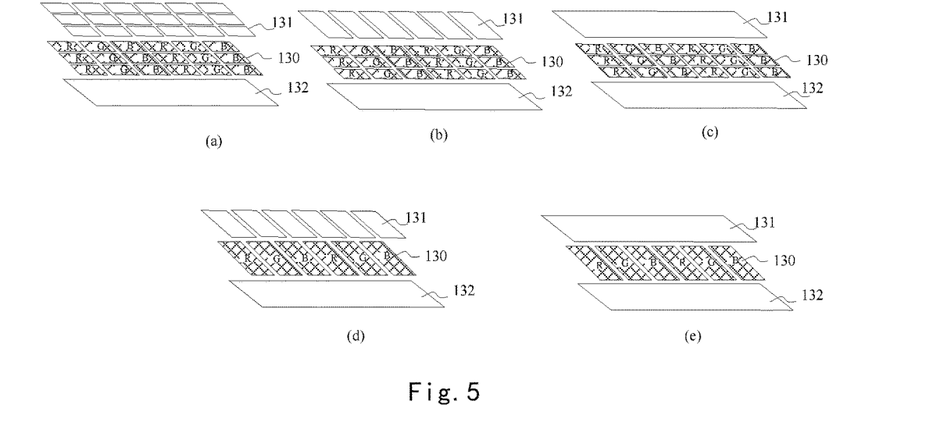
FIGS. 5a-5e are respectively five schematic structure views of a plurality of color control light-emitting units in FIG. 2.

Referring to FIG. 5a, the plurality of color control light-emitting units 13 are arranged in a 2D dot matrix. Specifically, the light-emitting functional layers 130 are arranged in a 2D dot matrix. Besides, the anodes 131 are similarly arranged in a 2D dot matrix and correspond to each light-emitting functional layer 130, while the cathodes 132 are in a planar shape. That is to say, cathodes of each color control light-emitting unit 13 are in a planar shape when connected. Alternatively, the anodes 131 can be in a planar shape and the cathodes 132 can be distributed in a 2D dot matrix. In this way, brightness of each dot can be controlled. In this embodiment, it is generally required that brightness of dots with a same color is the same. Therefore, each dot anode 131 corresponding to the light-emitting functional layers 130 of the same color can be connected via a connection wire, such that a voltage can be applied to these dot anodes 131 and light-emitting units of different colors can be controlled individually. Obviously, all of the dot anodes 131 can be connected via a connection wire.

Referring to FIG. 5b, the plurality of color control light-emitting units 13 are arranged in a 2D dot matrix. Specifically, the light-emitting functional layers 130 are distributed in a 2D dot matrix, and the anodes 131 are in a strip shape. That is to say, anodes of a row of color control light-emitting units 13 are in a strip shape when connected, and arranged in a one-dimensional array. Besides, each anode 131 corresponds to a row of light-emitting functional layers 130. Additionally, the cathodes 132 are in a planar shape. Alternatively, a row of red (R) light-emitting functional layer 130, a row of green (G) light emitting functional layer 130 and a row of blue (B) light emitting functional layer 130 can correspond to a strip anode 131 respectively. Preferably, each strip anode 131 corresponding to light-emitting functional layers 130 of a same color can be connected via a connection wire, such that a voltage can be applied to these strip anodes 131. As a result, light-emitting units of different colors can be controlled individually. Obviously, all of the strip anodes 131 can be connected via a connection wire.

Referring to FIG. 5c, the plurality of color control light-emitting units 13 are arranged in a 2D dot matrix. Specifically, the light-emitting functional layers 130 are distributed in a 2D dot matrix, but anodes 131 and cathodes 132 are both arranged in a planar shape. Now, all of the light-emitting functional layers 130 can be driven by a same driving electric field.

Referring to FIG. 5d, the plurality of color control light-emitting units 13 are arranged in a one-dimensional array. Specifically, the light-emitting functional layers 130 are in a strip shape and arranged in a one-dimensional array. Besides, the anodes 131 are in a strip shape and correspond to each light-emitting functional layer 130, and the cathodes 132 are in a planar shape, and vice versa. Preferably, each strip anode 131 corresponding to the light-emitting functional layers 130 of a same color can be connected via a connection wire, such that a voltage can be applied to these strip anodes 131. Obviously, all of the strip anodes 131 can be connected via a connection wire.

Referring to FIG. 5e, the plurality of color control light-emitting units 13 are arranged in a one-dimensional array. Specifically, the light-emitting functional layers 130 are in a strip shape and arranged in a one-dimensional array, but the anodes 131 and the cathodes 132 are both in a planar shape. Now, all of the light-emitting functional layers 130 can be driven by a same driving electric field.

Obviously, the plurality of color control light-emitting units 13 can be arranged in other different ways, which will not be listed here.

The light-emitting functional layer 130 can comprise: a hole transport layer (HTL), a light-emitting layer (EL) and an electron transport layer (ETL). Specifically, the light-emitting layer can be an organic light-emitting functional layer. Here, structures and materials of existing OLEDs can be referred to.

In addition, it should be noted that in this embodiment, the color control light-emitting unit 13 can be either of a top emission type or a bottom emission type, as long as light rays it emits can be emitted towards the transmittance adjustment pixel unit 15. For example, the color control light-emitting unit 13 is of a bottom emission type, and the cathode 132 is closer to the first substrate than the anode 131 is. As another example, the color control light-emitting unit 13 is of a top emission type, and the anode 131 is closer to the first substrate 11 than the cathode 132 is. These are only used as examples, and the present disclosure will not be limited thereto.

The so-called transmittance adjustment pixel unit 15 refers to a structure capable of adjusting transmittance of a light ray. When light rays of different colors emitted by the color control light-emitting units 13 pass various transmittance adjustment pixel units 15, each transmittance adjustment pixel unit 15 will adjust transmittances of the incident light rays respectively, so as to control brightness of light rays emitted out from each transmittance adjustment pixel unit 15. In this way, the display device 1 displays a picture satisfying color and greyscale requirements of each pixel.

Exemplarily, the transmittance adjustment pixel unit 15 can adopt structures such as an electrophoretic cell. Given that liquid crystal control techniques are comparatively mature, referring to FIGS. 6a-6b, each transmittance adjustment pixel unit 15 in this embodiment preferably includes a liquid crystal layer 150, as well as a pixel electrode 151 and a common electrode 152 for providing a driving electric field to the liquid crystal layer.

Figure 6:
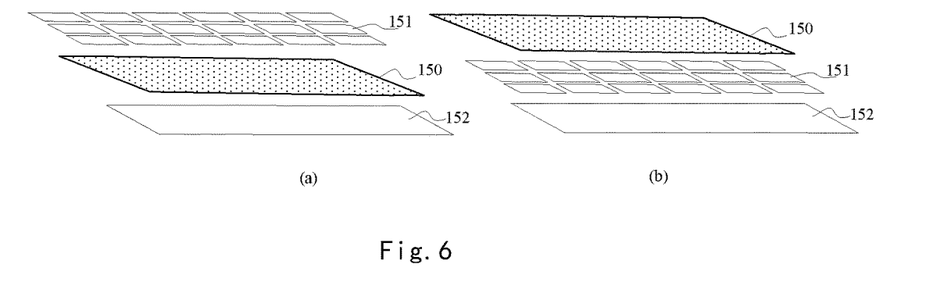
FIGS. 6a-6b are respectively two schematic structure views of a plurality of transmittance adjustment pixel units in FIG. 2.

Specifically, the liquid crystal layer 150 of the transmittance adjustment pixel unit 15 can adopt modes such as Twisted Nematic (TN), optically compensated Birefringence (OCB), Multi-domain Vertical Alignment (MVA) or Patterned Vertical Alignment (PVA) modes. In this case, as shown in FIG. 6a, the pixel electrode 151 and the common electrode 152 are provided on two sides of the liquid crystal layer 150 respectively. Either the pixel electrode 151 or the common electrode 152 can be closer to the second substrate 12. Apparently, circuit sections for powering the pixel electrode 151, for example, a gate line, a data line or a switch (such as a thin film transistor, TFT), are carried by a same substrate together with the pixel electrode 151.

Furthermore, the liquid crystal layer 150 of the transmittance adjustment pixel unit 15 can further adopt modes such as Advanced Super Dimension Switch (ADS), Fringe Field Switching (FFS) or In-Plane Switching (IPS) modes. In this case, as shown in FIG. 6b, the pixel electrode 151 and the common electrode 152 are located on a same side of the liquid crystal layer 150. Both electrodes can be located between the liquid crystal layer 150 and the second substrate 12. In this way, both electrodes are manufactured on an inner side of the second substrate 12, and carried by the second substrate 12. Obviously, both electrodes can be located between the liquid crystal layer 150 and the wire grid polarizer 14, and carried by the first substrate 11. It should be noted that the drawing only indicates a positional relationship between the two electrodes and the liquid crystal layer 150, wherein the two electrodes are provided on different layers and the common electrode 152 is in a planar shape. In fact, the two electrodes can also be located on a same layer, and the common electrode 152 can also be arranged in a dot matrix, and so on.

In addition, since the color control light-emitting unit 13 can emit light rays of multiple colors, it is unnecessary to arrange a color film layer (which can also be called a color filter) in the transmittance adjustment pixel unit 15.

The wire grid polarizer (WGP) 14 can be manufactured by a nanoimprint technique, and for specific details, any existing approach can be referred to.

Furthermore, referring to FIG. 2, the display device 1 further comprises a polarizer 16 arranged on an outer side of the second substrate 12. The polarizer 16 can be an ordinary polarizer 16. Of course, it can also be a wire grid polarizer. If a wire grid polarizer is used, it can also be arranged on an inner side of the second substrate 12. Generally speaking, polarization directions of the polarizer 16 and the wire grid polarizer 14 can be perpendicular to each other.

It should be noted that only a primary structure is described in an embodiment of the present disclosure. Those skilled in the art can know from existing approaches and upon actual needs that the display device is further provided with structures such as alignment films. Moreover, electrodes of different functions usually cannot be electrically connected, and thus those skilled in the art can arrange insulating layers upon actual needs.

In a display device provided according to an embodiment of the present disclosure, the lower POL can be replaced by a wire grid polarizer. Besides, the wire grid polarizer can also be arranged on an inner side of the substrates. As a result, two substrates inside the display device can be omitted with only the first substrate and the second substrate retained. This helps to reduce a thickness of the display device. In addition, since the display device in the present embodiment does not need to bond panels through a binder, the manufacture process is simplified. Again, in an embodiment of the present disclosure, the color control light-emitting units are only responsible for emitting light rays of a certain color, instead of controlling changes in brightness of these light rays. In other words, for color control light-emitting units of a same color, brightness of light rays emitted thereby is theoretically the same (given the a voltage between the corresponding anode and cathode is stable, i.e., does not change with time), and will not change with picture in display. Correspondingly, the transmittance color control light-emitting units are responsible for controlling the transmittance or the display greyscale. In this case, residual problems of the color control light-emitting units caused by changes in greyscale can be avoided. Thereby, the service life of the color control light emitting unit can be prolonged.

Figure 7:
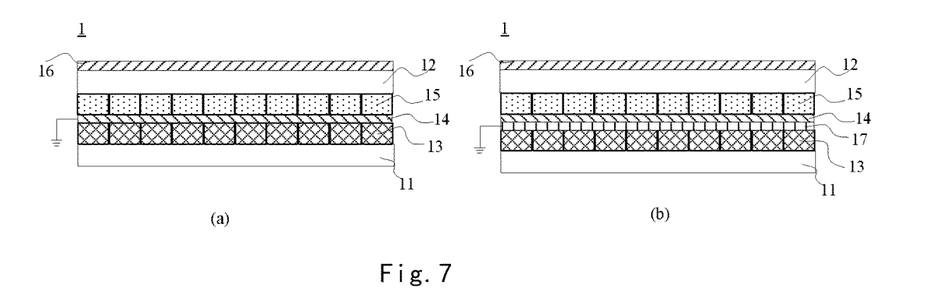
FIGS. 7a-7b are respectively schematic structure views of two types of display devices provided according to an embodiment of the present disclosure.

An embodiment of the present disclosure further provides another display device. Referring to FIG. 7, the display device includes a first substrate 11 and a second substrate 12 arranged oppositely; and a plurality of color control light-emitting units 13, a wire grid polarizer 14 and a plurality of transmittance adjustment pixel units 15 arranged sequentially from an inner side of the first substrate 11 towards an inner side of the second substrate 12, i.e., from bottom to top between the first substrate 11 and the second substrate 12 in the drawing. Furthermore, the display device can further comprise a polarizer 16.

For explanations of each component above, the above indicated embodiment can be referred to, which will not be repeated here for simplicity.

This embodiment is directed at a case in which pixel electrodes 151 and common electrodes 152 in the transmittance adjustment pixel unit 15 are located on a same side of the liquid crystal layer 150, see FIG. 6b. In this case, liquid crystal molecules in the liquid crystal layer 150 are usually deflected under a horizontal driving electric field provided by the two electrodes. Thus, the transmittance can be adjusted. However, since the color control light-emitting unit 13 and the transmittance adjustment pixel unit 15 are accommodated in a same cell, no matter whether the two electrodes in the transmittance adjustment pixel unit 15 are located under the liquid crystal layer 150 or above the liquid crystal layer 150, they will probably be influenced by an electrode (either the anode 131 or the cathode 132) close to the transmittance adjustment pixel unit 15 in the color control light-emitting unit 13. Therefore, in certain exemplary embodiments, referring to FIG. 7a, the wire grid polarizer 14 is grounded, so as to function as a shield.

Furthermore in certain exemplary embodiments, referring to FIG. 7b, the display device 1 further comprises a transparent conductive layer 17. The transparent conductive layer 17 is grounded, and located between the color control light-emitting units 13 and the transmittance adjustment pixel units 15. For example, the transparent conductive layer 17 can be provided between the color control light emitting units 13 and the wire grid polarizer 14. Those skilled in the art should understand that insulating layers can be further arranged between the transparent conductive layer 17 and the color control light emitting units 13, so as to prevent the transparent conductive layer 17 from being electrically connected to electrodes in the color control light emitting units 13. Besides, the transparent conductive layer 17 and the wire grid polarizer 14 can be either in direct contact or insulated from each other via insulating layers.

Exemplarily, the transparent conductive layer 17 can be made of materials such as indium-tin oxide (ITO).

Apparently, those skilled in the art can determine upon specific needs whether to adopt the above two alternatives for preventing interferences of the electric field. For example, assuming that the pixel electrode 151 and the common electrode 152 are in a structure as shown by FIG. 6b, i.e., the two electrodes are located on two layers respectively, and the common electrode 152 is located below the pixel electrode 151 (i.e., the common electrode 152 is closer to the color control light-emitting unit 13), wherein the common electrode 152 is in a planar shape. In this case, the electric field of the color control light-emitting units 13 will not interfere with the liquid crystal layer 150 too much. Accordingly, the above electric field shielding scheme may not be adopted. As another example, if the pixel electrode 151 and the common electrode 152 are arranged on two sides of the liquid crystal layer 150 respectively, the above electric field shielding scheme may be adopted upon needs.

In a display device provided according to embodiments of the present disclosure, in consideration of possible interferences with the transmittance adjustment pixel units 15 from the color control light-emitting units 13 when the latter is powered, the wire grid polarizer 14 is grounded or a grounded transparent conductive layer 17 is added, so as to prevent the interference.

Figure 8:
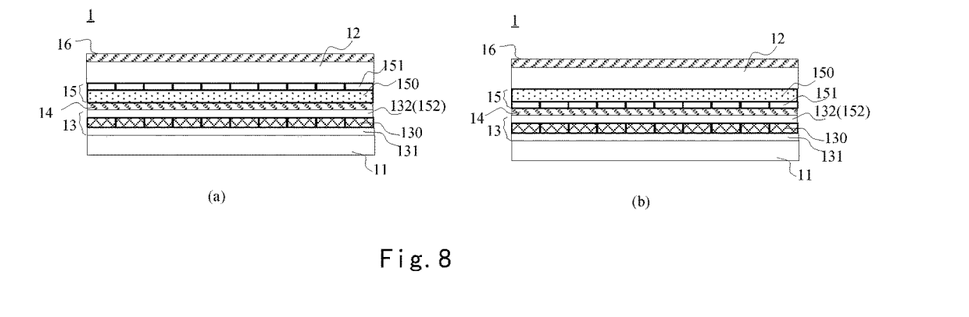
FIGS. 8a-8b are respectively schematic structure views of other two types of display devices provided according to an embodiment of the present disclosure.

An embodiment of the present disclosure provides another display device. Referring to FIG. 8, the display device includes a first substrate 11 and a second substrate 12 arranged oppositely; as well as a plurality of color control light-emitting units 13, a wire grid polarizer 14 and a plurality of transmittance adjustment pixel units 15 arranged sequentially from an inner side of the first substrate 11 towards an inner side of the second substrate 12.

Specifically, for components other than the transmittance adjustment pixel units 15, the above indicated embodiments can be referred to.

In this embodiment, the cathodes 132 in the color control light-emitting unit 13 are further away from the first substrate 11 than the anodes 131 are. Specifically referring to the drawings, the cathodes 132 are located above the anodes 131. Besides, the cathodes 132 can be arranged in a 2D dot matrix or a one-dimensional array. Alternatively, they can also be a planar electrode.

The transmittance adjustment pixel unit 15 includes a liquid crystal layer 150 and a pixel electrode 151 located on a side of the liquid crystal layer 150. In this case, the pixel electrode 151 and the cathode 132 are used for providing a driving electric field to the liquid crystal layer 150. In other words, in this embodiment, the common electrode 152 in the transmittance adjustment pixel unit 15 and the cathode 132 in the color control light-emitting unit 13 are shared. Therefore, the manufacture of an electrode can be reduced. Thereby, the manufacture process is simplified and the cost is decreased.

Exemplarily, referring to FIG. 8a, the pixel electrode 151 in the transmittance adjustment pixel unit 15 is located between the liquid crystal layer 150 and the second substrate 12. As a result, a perpendicular electric field between the pixel electrode 151 and the cathode 132 can drive liquid crystals in the liquid crystal layer 150 to deflect. For example, a voltage of the cathodes 132 can be stabilized at −5V, and a drive voltage can be applied to the pixel electrode 151 upon needs, so as to form an electric field between the cathode 132 and the pixel electrode 151.

Furthermore exemplarily, referring to FIG. 8b, the pixel electrode 151 in the transmittance adjustment pixel unit 15 is located below the liquid crystal layer 150. In this way, the electric field between the pixel electrode 151 and the cathode 132 can also drive liquid crystals in the liquid crystal layer 150 to deflect.

Based on any of the above embodiments, a light correction section can be added according to other embodiments of the present disclosure. For the other components, depictions in the above embodiments can be referred to, which will not be repeated here for simplicity.

Figure 9:
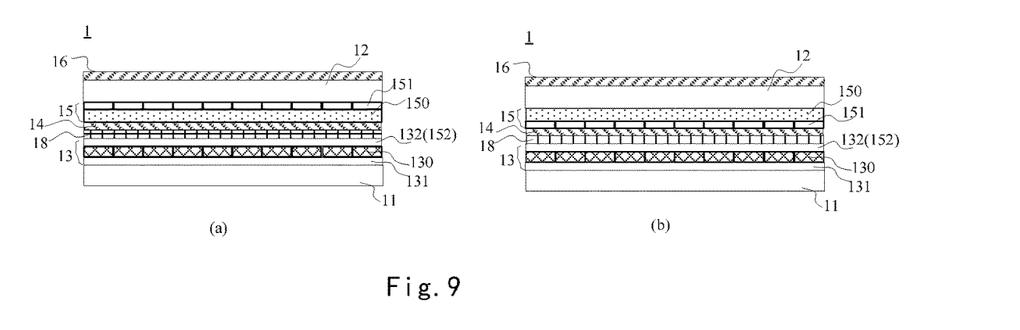
FIGS. 9a-9b are respectively schematic structure views of yet another two types of display devices provided according to an embodiment of the present disclosure.

Referring to FIG. 9, the display device 1 further comprises a light correction section 18. The light correction section 18 is located between the color control light-emitting units 13 and the transmittance adjustment pixel units 15, and used for correcting incident light rays into exit light rays perpendicular to the second substrate 12.

FIG. 9 is based on the display device provided in the embodiment just described before. Those skilled in the art can know from depictions that a structure of a light correction section 18 can also be added based on the above other embodiments.

A position of the light correction section 18 relative to the wire grid polarizer 14 is not defined. For example, the light correction section 18 can be located below the wire grid polarizer 14. I.e., the light correction section 18 is located between the wire grid polarizer 14 and the color control light-emitting units 13. Obviously, their positions are exchangeable. In this embodiment, the former is preferred. In this way, by using the light correction section 18, the wire grid polarizer 14 can be prevented from contacting electrodes in the color control light-emitting unit 13. Generally speaking, the light correction section 18 is made of a transparent nonconductive material. For example, it can be made of a transparent organic material.

The light correction section 18 is used for correcting incident light rays into exit light rays perpendicular to the second substrate 12. The exit light rays can also be called vertical light rays. The incident light rays here refer to light rays emitted out from the color control light-emitting unit 13 and incident on the light correction section 18. The exit light rays refer to light rays emitted out from the light correction section 18. The vertical exit light rays are emitted out of the display device 1 via the transmittance adjustment pixel units 15 and can be regarded as substantially vertical light rays emitted out of the display device 1 despite influences of the liquid crystal layer and so on.

Figure 10:
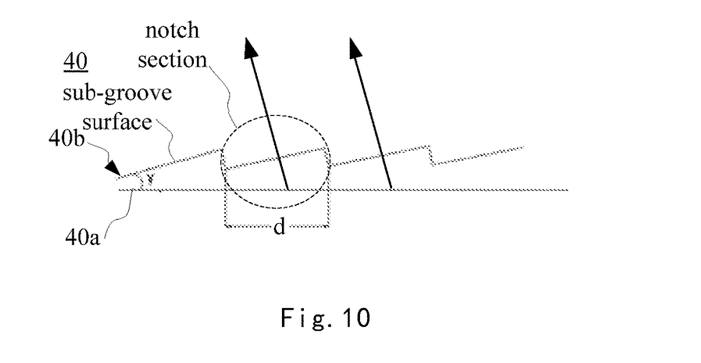
FIG. 10 is a schematic view of a diffraction grating provided according to an embodiment of the present disclosure.

A specific structure of the light correction section 18 will be described below in detail. In this embodiment, the light correction section 18 can comprise a diffraction microstructure. The diffraction microstructure can be a diffraction grating 40 as shown in FIG. 10.

The diffraction grating 40 is made of a transparent material and specifically a transmissive diffraction grating. The diffraction grating 40 comprises a grating surface 40a and a groove surface 40b. Specifically, the diffraction grating 40 can be a blazed grating. In this case, the groove surface 40b is in a zigzag shape, and an angle enclosed between the zigzag-shaped groove surface 40b and the grating surface 40a is called a blazed angle indicated by γ. The blazed angle is generally an acute angle. As can be seen from the drawing, the diffraction grating 40 comprises a plurality of notch sections, and a corresponding width of each notch section is called a notch cycle indicated by d. For each notch section, parameters such as ds and γs can be either the same or different. In order to facilitate depiction, on the groove surface 40b, adjacent surfaces (where the meaning of an adjacent edge is adopted) constituting the blazed angle γ of two surfaces in a notch section are called sub-groove surfaces.

Now the principle of light ray correction by the diffraction grating 40 will be discussed. According to the diffraction of light, if an incident direction and a wavelength of light rays incident on the diffraction grating 40 satisfy a certain condition, a light beam with such a wavelength will be blazed out intensively at a specific angle. Exemplarily, if light rays incident on the groove surface 40b are perpendicular to the groove surface 40b and satisfy 2d*sin γ=λ, the light beam with a wavelength of λ will be blazed out intensively at a specific angle, especially perpendicular to the sub-groove surfaces of the groove surface 40b. Accordingly, by choosing γ and d for each notch section, light rays incident on the diffraction grating 40 can be converted into parallel light rays that have a predetermined wavelength and are emitted out at a predetermined angle.

In view of the above, by choosing different ds and γs, different light exit angles and different light exit wavebands can be obtained. Specifically for this embodiment, the diffraction grating 40 has a function of selecting the incident light rays. Specifically, it can select parallel light rays perpendicular to the sub-groove surfaces to be emitted out.

Preferably, if γs of each notch section are the same, i.e., the sub-groove surfaces are parallel, the diffraction grating 40 can select multiple groups of parallel light beams, wherein each group of parallel light beams is perpendicular to the sub-groove surfaces. In other words, light rays emitted out from the diffraction grating 40 are parallel light rays perpendicular to the groove surface 40b. In this case, different ds can be selected for different notch sections, such that wavebands of the exit light rays are different.

In light of the above principle, the following light correction section 18 is provided in this embodiment.

Figure 11:
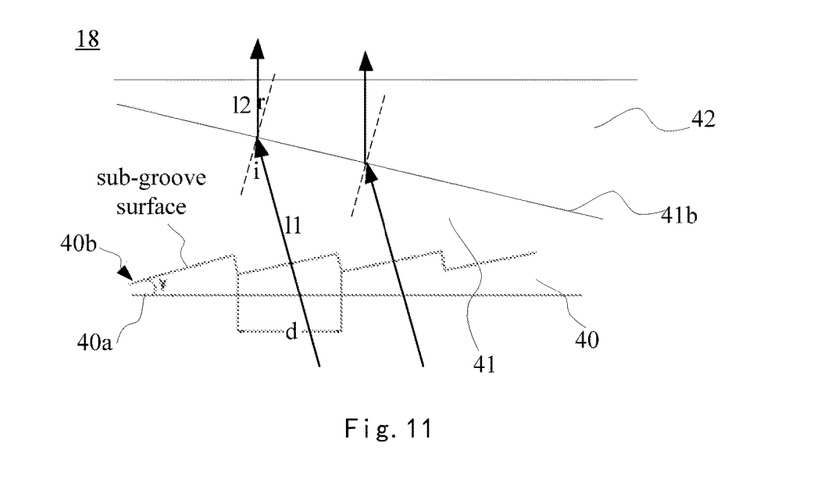
FIG. 11 is a schematic view of a light correction section provided according to an embodiment of the present disclosure.

Referring to FIG. 11, the light correction section 18 provided in this embodiment can comprise a diffraction grating 40 and a first dielectric layer 41.

The diffraction grating 40 comprises a grating surface 40a and a groove surface 40b. The groove surface 40b comprises a plurality of sub-groove surfaces, and each sub-groove surface is arranged obliquely. It should be noted that the so-called oblique arrangement refers to an arrangement neither parallel to the second substrate 12 nor perpendicular to the second substrate 12. Specifically, the grating surface 40a is a light incident surface and the groove surface 40b is a light exit surface. In order to facilitate the arrangement, in this embodiment, the grating surface 40a is optionally parallel to the second substrate 12, and thus the sub-groove surfaces will inevitably be oblique. In combination with an operation principle of the above diffraction grating, light rays emitted out from the groove surface 40b can be perpendicular to each sub-groove surface. In this case, light rays emitted out from the groove surface 40b will not be perpendicular to the second substrate 12. Therefore, it is still necessary to perform correction again via the first dielectric layer 41.

It should be noted that in order that light rays emitted out from the groove surface 40b are parallel light rays, preferably, each sub-groove surface of the groove surface 40b is arranged in parallel.

The first dielectric layer 41 is located on the groove surface 40b of the diffraction grating. The light rays emitted out from the diffraction grating 40 are refracted by the light exit surface 41b of the first dielectric layer, and then become exit light rays perpendicular to the second substrate 12. According to the above preferred solution, each sub-groove surface is parallel to each other. Then, the light rays emitted out from the diffraction grating 40 are parallel light rays perpendicular to the groove surface 40b. In this way, the light exit surface 41b of the first dielectric layer can be simplified in design.

Figure 12:
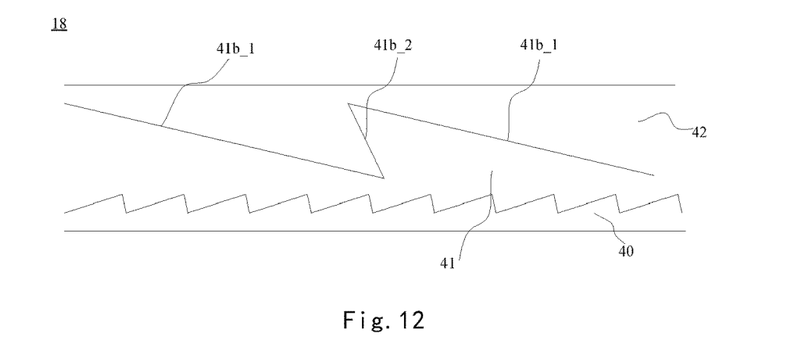
FIG. 12 is a schematic view of another light correction section provided according to an embodiment of the present disclosure.

It should be noted that as shown in FIG. 11, the light exit surface 11b of the first dielectric layer can comprise a ramp, and the ramp is usually planar. However, a thickness of such a dielectric layer at the left end will still be comparatively great. Therefore, in this embodiment, preferably, as shown in FIG. 12, the light exit surface 41b of the first dielectric layer comprises a plurality of parallel refractive sub-surfaces 41b_1. As shown in the drawing, each refractive sub-surface is a planar ramp. The light exit surface 41b further comprises a connection sub-surface 41b_2 for connecting these refractive sub-surfaces 41b_1. Specifically, the refractive sub-surfaces 41b_1 are used for refracting the light rays emitted out from the diffraction grating 40 into light rays perpendicular to the second substrate 12. In addition to a connection function, the connection sub-surface 41b_2 can also avoid interferences with light rays. Preferably, the connection sub-surface 41b_2 can be made perpendicular to the sub-groove surfaces of the diffraction grating 40.

The light rays are refracted on an interface between the first dielectric layer 41 and another transparent dielectric (indicated by dielectric W). For the interface, the transmission direction of the incident light rays 11 is known. Besides, the transmission direction of the refracted light rays 12 should satisfy requirements of being perpendicular to the second substrate 12, so it is also known. Secondly, after a transparent material of the first dielectric layer 41 is selected, the refractive index n1 of the first dielectric layer 41 is also known. Furthermore, if the position of the light correction section 18 is set, the refractive index n2 of the dielectric W can also be known. For example, if the light correction section 18 only comprises the diffraction grating 40 and the first dielectric layer 41, and the first dielectric layer 41 is in direct contact with the liquid crystal layer, n2 is namely the refractive index of the liquid crystal layer. As another example, if the light correction section 18 only comprises the diffraction grating 40 and the first dielectric layer 41, and the light correction section 18 is located on an outer side of the upper polarizer in the display panel, n2 is namely the refractive index of the air. Based on the above known parameters, and in combination with the law of refraction, an interface (i.e., the light exit surface 41b of the first dielectric layer) satisfying these requirements can be achieved. In this way, an oblique direction and an oblique angle for the light exit surface 41b of the first dielectric layer can be obtained.

Preferably, as shown in FIG. 11, in this embodiment, the oblique direction of the sub-groove surfaces of the groove surface 40b is opposite to that of the light exit surface 41b of the first dielectric layer. Specifically, the oblique direction of the sub-groove surfaces declines from right to left, while the oblique direction of the light exit surface 41b of the first dielectric layer declines from left to right. This helps to facilitate thinning of the light correction section 18. According to a map of optical path and the law of refraction, n1*sin i=n2*sin r. In this case, since i is greater than r, it is necessary that n1<n2. In other words, the refractive index of the dielectric W should be greater than that of the first dielectric layer 41.

Furthermore preferably, as shown in FIGS. 11 and 12, the light correction section 18 further comprises a second dielectric layer 42. The second dielectric layer 42 is located on the light exit surface of the first dielectric layer 41. Besides, a light exit surface of the second dielectric layer is parallel to the second substrate 12. Since the light rays refracted from the light exit surface of the first dielectric layer 41 has already been perpendicular to the second substrate 12, the light rays will not be refracted when passing the exit surface of the second dielectric layer 42, such that the exit light rays from the light correction section 18 are perpendicular to the second substrate 12.

Figure 13:
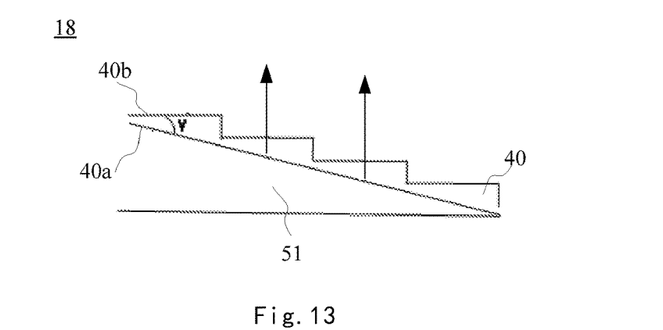
FIG. 13 is a schematic view of yet another light correction section provided according to an embodiment of the present disclosure.

As shown in FIG. 13, this embodiment further provides another light correction section 18 comprising a diffraction grating 40. The diffraction grating 40 comprises a grating surface 40a and a groove surface 40b. The groove surface 40b comprises a plurality of sub-groove surfaces, and the sub-groove surfaces 40b are parallel to the second substrate 12. Specifically, the grating surface 40a is a light incident surface and the groove surface 40b is a light exit surface. In light of the principle of diffraction grating, the exit light rays from the diffraction grating 40 can have a specific wavelength, and be perpendicular to the second substrate 12.

If the light correction section 18 comprises only the diffraction grating 40, it will be difficult to secure the diffraction grating 40 in the display panel, since the grating surface 40a of the diffraction grating 40 here is in an oblique state. Therefore, preferably, the light correction section 18 further comprises a first dielectric layer 51. The diffraction grating 40 is located on the first dielectric layer 51. Specifically, the grating surface 40a of the diffraction grating fits to the first dielectric layer 51. As a result, the first dielectric layer 51 has a function of supporting the diffraction grating.

Figure 14:
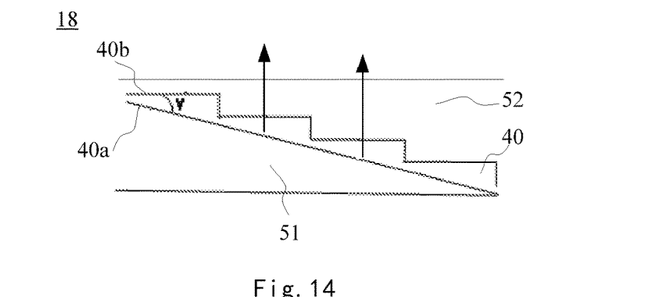
FIG. 14 is a schematic view of still another light correction section provided according to an embodiment of the present disclosure.

In certain exemplary embodiments, in order to further protect the groove surface 40b of the diffraction grating 40, as shown in FIG. 14, the light correction section 18 can further comprise a second dielectric layer 52. The second dielectric layer is located on the groove surface 40b of the diffraction grating, and a light exit surface of the second dielectric layer 52 is parallel to the second substrate 12. By doing this, the added second dielectric layer 52 will not change the transmission direction of the originally vertical light rays.

Figure 15:
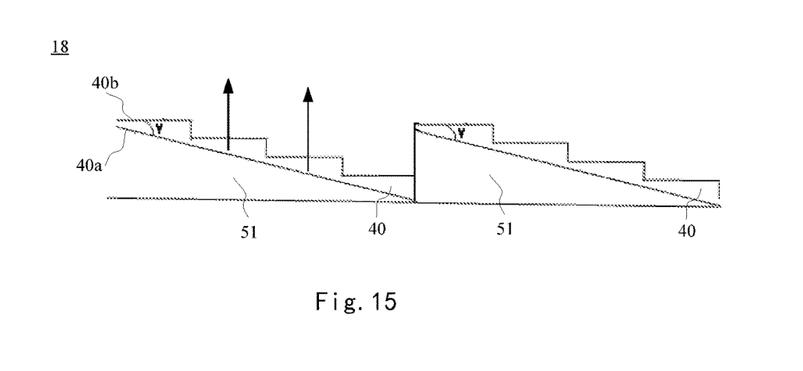
FIG. 15 is a schematic view of a further light correction section provided according to an embodiment of the present disclosure.

Furthermore, in consideration of an overall thickness of the light correction section 18, referring to FIG. 15, there can be multiple diffraction gratings 40 or multiple first dielectric layers 51. Each first dielectric layer 51 and the diffraction grating 40 located thereon are arranged cyclically in an extension direction of the second substrate. This helps to reduce a thickness of the light correction section 18.

What is mentioned above mainly describes the transmission direction of light rays, and given that a light beam with a specific wavelength will be blazed out intensively through a diffraction grating, a diffraction grating adapted to color characteristics can be designed below in this embodiment in combination with color characteristics of a color display panel.

Figure 16:
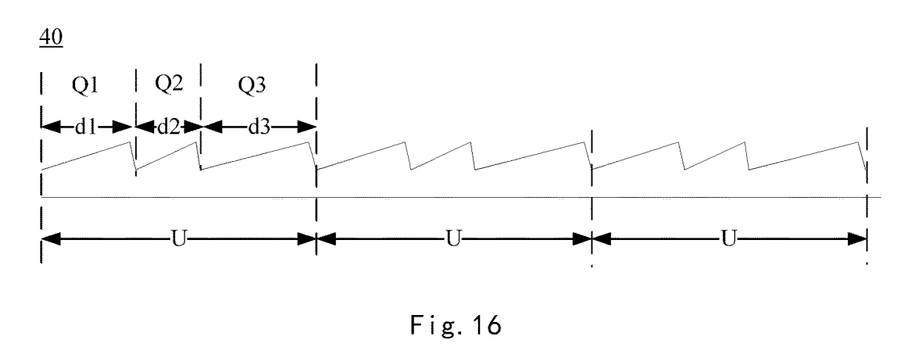
FIG. 16 is a schematic view of another diffraction grating provided according to an embodiment of the present disclosure.

Preferably, referring to FIG. 16, the diffraction grating 40 comprises notch sections arranged cyclically. The notch sections in each cycle U comprise notch groups arranged sequentially. Each notch group has a same number of notch sections. Specifically, This number can be one or more than one. The notch sections in a same notch group have a same shape, and the notch sections in different notch groups have different shapes More preferably, different notch groups in each cycle U correspond to different color control light-emitting units 13 respectively. Besides, wavebands that can be blazed out by the notch groups and light rays that can be emitted out by the corresponding color control light-emitting units 13 have a same color.

Exemplarily, as shown in FIG. 16, the notch sections in each cycle U comprises three notch groups Q1, Q2 and Q3 arranged sequentially. Each notch group comprises one notch section, and the notch sections in different notch groups have different shapes. The shape of the notch section is determined by parameters d and γ of the notch section. In this embodiment, preferably, the γs of all notch section are the same, i.e., all sub-groove surfaces are parallel. Specifically, for this embodiment, the notch section in the notch group Q1 has a notch width of d1, the notch section in the notch group Q2 has a notch width of d2, and the notch section in the notch group Q3 has a notch width of d3, wherein d1, d2 and d3 are all different. As can be known from the operation principle of a diffraction grating, the light rays that can be blazed out intensively through the three sub-groove surfaces have different wavelengths. Exemplarily, by adjusting the notch width, the three sub-groove surfaces can respectively blaze out wavebands of light rays of three primary colors, for example, wavebands of red, green and blue. Specifically, the notch sections that can blaze out red light correspond to red light-emitting units, such that light rays emitted by the red light-emitting units blaze out red light when passing the corresponding notch sections. Likewise, the notch sections that can blaze out green light correspond to green light-emitting units, and the notch sections that can blaze out blue light correspond to blue light-emitting units.

In a display device provided according to an embodiment of the present disclosure, by adding a light correction section, vertical light rays can be selectively emitted out. This helps to facilitate subsequent control of the light rays.

Figure 17:
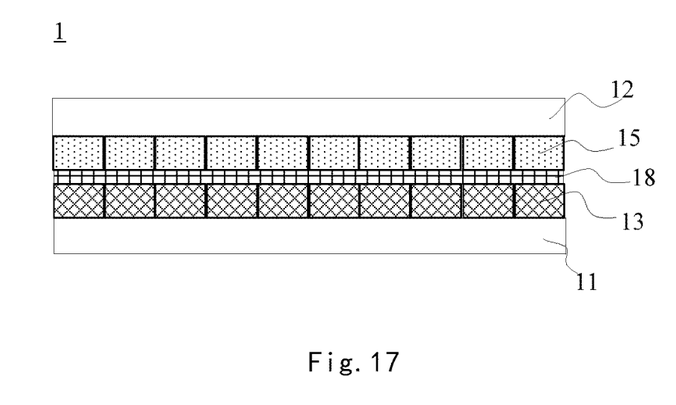
FIG. 17 is a schematic structure view of another display device provided according to an embodiment of the present disclosure.

As shown in FIG. 17, an embodiment of the present disclosure further provides another display device 1. Specifically, this display device 1 includes a plurality of color control light-emitting units 13; a light correction section 18 located in a light exit direction of the color control light-emitting units 13, wherein the light correction section 18 is used for correcting incident light rays into vertical light rays; and a plurality of transmittance adjustment pixel units 15 arranged in a light exit direction of the light correction section 18.

Preferably, the display device 1 can further comprise a first substrate 11 and a second substrate 12. The color control light-emitting units 13, the light correction section 18 and the transmittance adjustment pixel unit 15 are sandwiched between the two substrates. Specifically, the first substrate 11 is located on an outer side of the color control light-emitting units 13, and the second substrate 12 is located on an outer side of the transmittance adjustment pixel units 15. This helps to reduce the manufacture process.

Furthermore, as shown in FIG. 9, the display device 1 can further comprise a wire grid polarizer 18, which is arranged between the color control light-emitting units 13 and the transmittance adjustment pixel units 15. It can further comprise a polarizer 16 arranged on an outer side of the second substrate 12.

For depictions about each component, the embodiment as described just before can be referred to.

In an embodiment of the present disclosure, by adding a light correction section 18 in the display device, light rays emitted from the color control light-emitting units 13 are corrected into vertical light rays, such that the display device can emit approximately vertical light rays. This helps to facilitate subsequent control of the light rays.

It should be noted that the display device provided in each embodiment of the present disclosure can be any product having a display function, such as a television, a notebook computer, a digital photo frame, a handset, a tablet computer, a navigator and the like. Of course, it can further be a component having a display function, such as a display.

It should be further noted that the above embodiments are only used for illustrating technical solutions of the present disclosure, instead of limiting them. Although the present disclosure has been illustrated in detail with reference to the above embodiments, those having ordinary skills in the art should understand that they can still modify the technical solutions recited in the above embodiments or make equivalent substitutions for part of the technical features therein. These modifications or substitutions will not deflect the essence of the corresponding technical solutions from spirits and scopes of the technical solutions of each embodiment of the present disclosure.

The invention claimed is:

1. A display device, comprising:
a first substrate and a second substrate arranged oppositely; and
a plurality of color control light-emitting units, a wire grid polarizer and a plurality of transmittance adjustment pixel units arranged sequentially from an inner side of the first substrate towards an inner side of the second substrate, wherein
the plurality of color control light-emitting units is divided into a number of groups in an array, each group comprising several color control light-emitting units for emitting different colors of light, and
an orthographic projection of each color control light-emitting unit on the plurality of transmittance adjustment pixel units coincides with one corresponding transmittance adjustment pixel unit, wherein
each color control light-emitting unit comprises: a light-emitting functional layer, an anode and a cathode located on two sides of the light-emitting functional layer respectively,
the cathode is further away from the first substrate than the anode is, and
each transmittance adjustment pixel unit comprises: a liquid crystal layer and a pixel electrode located on a side of the liquid crystal layer, wherein the pixel electrode and the cathode are used for providing a driving electric field to the liquid crystal layer.

2. The display device according to claim 1, wherein
the display device further comprises a light correction section, wherein the light correction section is located between the color control light-emitting units and the transmittance adjustment pixel units, and is used for correcting incident light rays into exit light rays perpendicular to the second substrate.

3. A display device, comprising:
a first substrate and a second substrate arranged oppositely; and
a plurality of color control light-emitting units, a wire grid polarizer and a plurality of transmittance adjustment pixel units arranged sequentially from an inner side of the first substrate towards an inner side of the second substrate, wherein
the plurality of color control light-emitting units is divided into a number of groups in an array, each group comprising several color control light-emitting units for emitting different colors of light, and
an orthographic projection of each color control light-emitting unit on the plurality of transmittance adjustment pixel units coincides with one corresponding transmittance adjustment pixel unit, wherein
the display device further comprises a light correction section, wherein the light correction section is located between the color control light-emitting units and the transmittance adjustment pixel units, and is used for correcting incident light rays into exit light rays perpendicular to the second substrate,
wherein, the light correction section comprises:
a diffraction grating, wherein the diffraction grating comprises a grating surface and a groove surface, the groove surface comprises a plurality of sub-groove surfaces, and each sub-groove surface is arranged obliquely, wherein the grating surface is a light incident surface, and the groove surface is a light exit surface; and
a first dielectric layer located on the groove surface of the diffraction grating, wherein light rays emitted out from the diffraction grating become exit light rays perpendicular to the second substrate after being refracted by the light exit surface of the first dielectric layer, wherein, the sub-groove surfaces are arranged in parallel to each other, and the light exit surface of the first dielectric layer comprises a ramp or a plurality of parallel refractive sub-surfaces.

4. The display device according to claim 3, wherein the light correction section further comprises a second dielectric layer, wherein the second dielectric layer is located on the light exit surface of the first dielectric layer, and a light exit surface of the second dielectric layer is parallel to the second substrate.

5. The display device according to claim 3, wherein an oblique direction of the sub-groove surfaces is opposite to that of the light exit surface of the first dielectric layer.

6. The display device according to claim 3, wherein the diffraction grating comprises notch sections arranged cyclically, wherein the notch sections in each cycle comprises notch groups arranged sequentially, and each notch group has a same number of notch sections, wherein notch sections in a same notch group have a same shape, and notch sections in different notch groups have different shapes.

7. A display device, comprising:

a plurality of color control light-emitting units;

a light correction section located in a light exit direction of the color control light-emitting units, wherein the light correction section is used for correcting incident light rays into vertical light rays; and a plurality of transmittance adjustment pixel units arranged in a light exit direction of the light correction section, wherein the plurality of color control light-emitting units is divided into a number of groups in an array, each group comprising several color control light-emitting units for emitting different colors of light, and an orthographic projection of each color control tight-emitting unit on the plurality of transmittance adjustment pixel units coincides with one corresponding transmittance adjustment pixel unit, wherein each color control light-emitting unit comprises: a light-emitting functional layer, an anode and a cathode located on two sides of the light-emitting functional layer respectively, the cathode is further away from the first substrate than the anode is, and each transmittance adjustment unit comprises: a liquid crystal layer and a pixel electrode located on a side of the liquid crystal laver, wherein the pixel electrode and the cathode are used for providing a driving electric field to the liquid crystal layer.

* * * * *